(12) United States Patent
Morita et al.

(10) Patent No.: US 7,718,507 B2
(45) Date of Patent: May 18, 2010

(54) BONDED WAFER AND METHOD OF PRODUCING THE SAME

(75) Inventors: Etsurou Morita, Tokyo (JP); Kazuo Hujie, Tokyo (JP); Isoroku Ono, Tokyo (JP)

(73) Assignee: Sumco Corporation, Tokyo (JP)

( * ) Notice: Subject to any disclaimer, the term of this patent is extended or adjusted under 35 U.S.C. 154(b) by 101 days.

(21) Appl. No.: 11/716,341

(22) Filed: Mar. 8, 2007

(65) Prior Publication Data

US 2007/0243694 A1   Oct. 18, 2007

(30) Foreign Application Priority Data

Apr. 14, 2006   (JP) .............................. 2006-112460

(51) Int. Cl.
*H01L 21/30* (2006.01)
(52) U.S. Cl. ........................ 438/455; 438/458; 438/459; 438/692; 257/E21.568
(58) Field of Classification Search ................ 438/455, 438/458, 459, 692; 257/E21.568
See application file for complete search history.

(56) References Cited

U.S. PATENT DOCUMENTS

| | | | | |
|---|---|---|---|---|
| 6,022,268 | A * | 2/2000 | Roberts et al. | .............. 451/548 |
| 6,217,427 | B1 * | 4/2001 | Case et al. | ................. 451/296 |
| 2004/0219370 | A1 * | 11/2004 | Aga et al. | .................... 428/446 |
| 2006/0042501 | A1 * | 3/2006 | Miyazaki | ....................... 106/3 |

FOREIGN PATENT DOCUMENTS

| | | |
|---|---|---|
| EP | 0444942 A | 9/1991 |
| EP | 0854500 A | 7/1998 |
| EP | 1170801 A | 1/2002 |
| JP | 2000-243942 | 9/2000 |
| JP | 2001-144274 | 5/2001 |
| JP | 2003-347526 | 12/2003 |

OTHER PUBLICATIONS

Rodel Product Sheet, "Rodel Silicon Final Polishing Slurries", Jun. 2001, Rodel Inc., Rev. 2.0.*
European Search Report dated Nov. 25, 2008.

* cited by examiner

*Primary Examiner*—Alexander G Ghyka
*Assistant Examiner*—Leonard Chang
(74) *Attorney, Agent, or Firm*—Sughrue Mion, PLLC

(57) ABSTRACT

A bonded wafer is produced by bonding an ion-implanted wafer for an active layer onto a wafer for a supporting substrate, and thereafter exfoliating the wafer for the active layer at the ion-implanted position through a heat treatment and then polishing a terrace portion of the resulting active layer with a predetermined fixed grain abrasive cloth to remove island-shaped projections on the terrace portion while controlling a scattering of terrace width and smoothness of an outer peripheral face of the active layer.

9 Claims, 3 Drawing Sheets

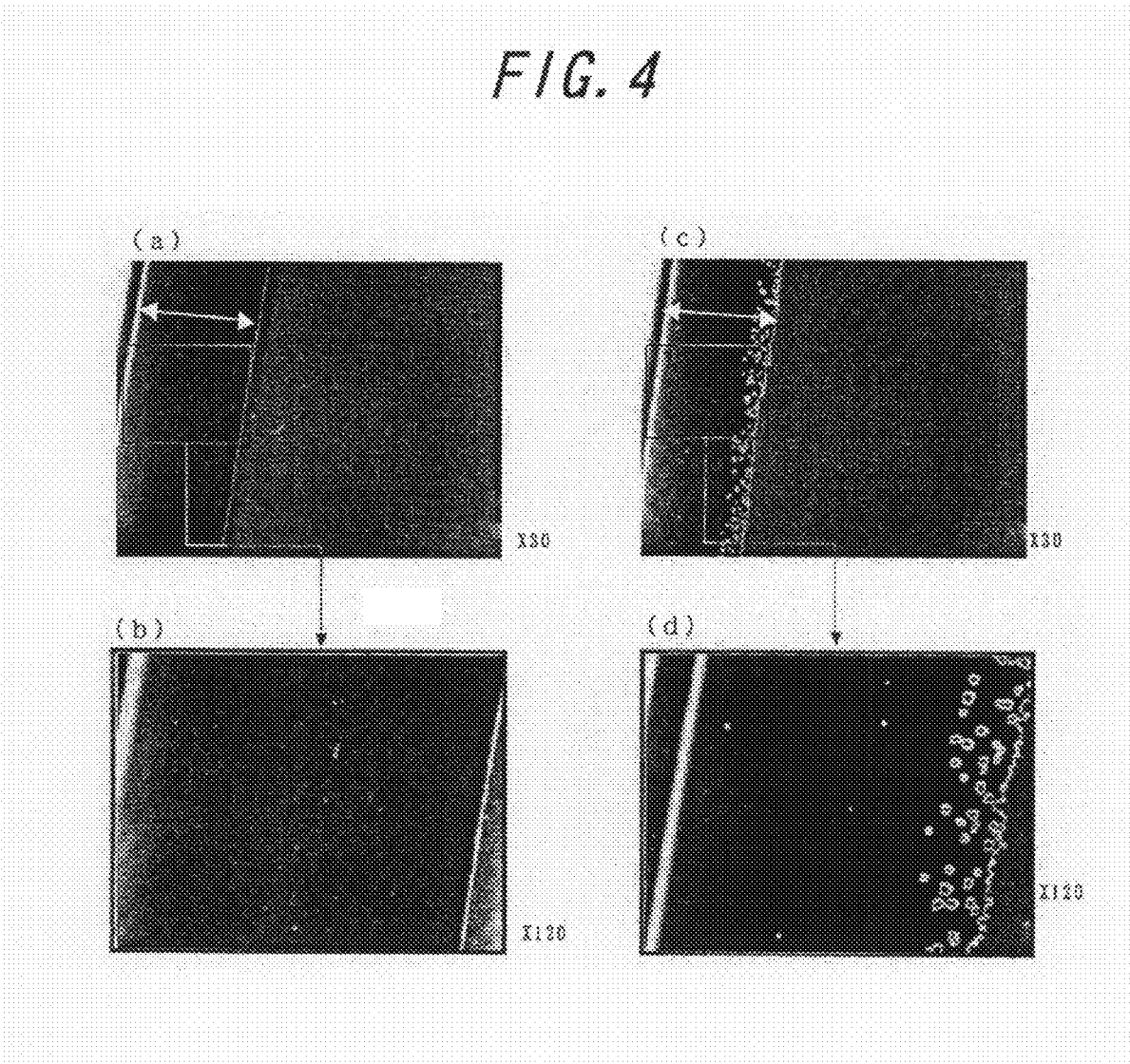

BONDED WAFER AND METHOD OF PRODUCING THE SAME

BACKGROUND OF THE INVENTION

1. Field of the Invention

This invention relates to a method of producing a bonded wafer by bonding a wafer for an active layer ion-implanted with a light element such as hydrogen or helium to a given depth position onto a wafer for a supporting substrate, and thereafter exfoliating the wafer for the active layer at the ion-implanted portion of the given depth position through a heat treatment to leave an active layer on an outer peripheral portion of the wafer for the supporting substrate and then polishing a terrace portion of the active layer formed on the outer peripheral portion of the wafer for the supporting substrate due to sagging of an outer peripheral portion of the wafer for the active layer during the exfoliation.

2. Description of Related Art

As the method of producing the bonded wafer, there is a so-called smart cut method wherein a wafer for an active layer ion-implanted with a light element such as hydrogen or helium to a given depth position is bonded onto a wafer for a supporting substrate and thereafter subjected to a heat treatment to exfoliate the wafer for the active layer at the ion-implanted portion of the given depth position. In the smart cut method, the exfoliated portion of the wafer for the active layer after the bonding can be recycled as a wafer, which is different from the conventional bonding technique. By such a recycling it is made possible to use one wafer in the bonded wafer plural times, which leads the way to reduce the material cost. Also, the bonded wafer produced by the smart cut method is excellent in the thickness uniformity, so that this method is noticed as a promising method.

In the smart cut method, however, when the wafer for the active layer is exfoliated through the heat treatment, a terrace portion of the active layer is inevitably formed on the outer peripheral portion of the wafer for the supporting substrate due to the sagging of the outer peripheral portion of the wafer for the active layer during the exfoliation and also a part of the wafer for the active layer is firmly fixed onto the terrace portion to form island-shaped projections called as so-called SOI islands. If the SOI islands remain on the terrace portion, there is a fear that they render into particles during device processing to easily cause a pattern defect badly exerting on the characteristics or performances of the device. Therefore, in order to improve the quality of the bonded wafer, it is necessary that the SOI islands are removed by polishing the terrace portion to render the surface of the terrace portion into a clean state having no SOI island or the like.

As a first method of removing the SOI islands retained on the terrace portion is mentioned a method of suppressing the occurrence of SOI islands. For example, JP-A-2003-347526 discloses a method wherein the occurrence of SOI islands is reduced by changing an exfoliation annealing condition so that the temperature is raised from an annealing start temperature at a moderate gradient up to a dislocation temperature and thereafter the heating is conducted at a rapid gradient.

As a second method of removing the SOI islands retained on the terrace portion is mentioned a method of suppressing the occurrence of the terrace portion. For example, JP-A-2000-243942 discloses a method wherein a supporting substrate, an oxide film and an active layer are stepwise piled one upon the other to make an adhesion area between the outer peripheral portion of the active layer and the supporting substrate to thereby decrease the occurrence of SOI islands.

As a third method of removing the SOI islands retained on the terrace portion is mentioned a method of removing the terrace portion. For example, JP-A-2001-144274 discloses a method wherein the active layer is exfoliated through a heat treatment and thereafter an end portion of the bonded wafer is subjected to a beveling treatment to remove the terrace portion.

In the method of JP-A-2003-347526, however, it is impossible to completely remove the SOI islands. Also, the smoothness on the outer peripheral face of the active layer, which is an existing range of SOI islands on the outer peripheral portion of the active layer, is as large as not less than 20 μm, so that there is a fear that these islands are exfoliated to form particles in the subsequent device processing.

In the method of JP-A-2000-243942, since the end portion of the bonded wafer is stepwise, the end portion of the wafer for the supporting substrate becomes wasted. In the method of JP-A-2001-144274, since the end portion of the bonded wafer is removed by the beveling treatment, the thin active layer has a fear of causing contamination or damage through the beveling treatment, and hence a part of the effective active layer is cut out. As a result, there is a problem that the effective area of the wafer usable as a semiconductor substrate is made small.

SUMMARY OF THE INVENTION

It is, therefore, an object of the invention to provide a method of producing a bonded wafer wherein island-shaped projections retained on the terrace portion can be effectively removed by polishing the terrace portion of the active layer with a predetermined fixed grain abrasive cloth at a small polishing amount on the surface of the terrace portion.

In order to achieve the above object, the summary and construction of the invention are as follows.

(1) A method of producing a bonded wafer by bonding a wafer for an active layer ion-implanted with a light element such as hydrogen or helium to a given depth position onto a wafer for a supporting substrate, and thereafter exfoliating the wafer for the active layer at the ion-implanted portion of the given depth position through a heat treatment to leave an active layer on an outer peripheral portion of the wafer for the supporting substrate and then polishing a terrace portion of the active layer formed on the outer peripheral portion of the wafer for the supporting substrate due to sagging of an outer peripheral portion of the wafer for the active layer during the exfoliation, in which the polishing of the terrace portion of the active layer is carried out with a predetermined fixed grain abrasive cloth to remove island-shaped projections on the terrace portion made from a part of the active layer while controlling a scattering of terrace width and smoothness of an outer peripheral face of the active layer to a given range.

(2) A method of producing a bonded wafer according to item (1), wherein the fixed grain abrasive cloth comprises a urethane bonding material made from a soft segment having a polyfunctional isocyanate and a hard segment having a polyfunctional polyol and having an expansion ratio of 1.1-1.4 times, and silica having an average particle size of 0.2-10 μm and a hydroxy group, and a ratio of the hard segment in the urethane bonding material is 40-60% as a molecular weight ratio and a ratio of silica in the whole of the fixed grain abrasive cloth is 20-70 volume %, and the fixed grain abrasive cloth has a Shore D hardness of 40-100.

(3) A method of producing a bonded wafer according to item (1) or (2), wherein the polishing is carried out by using an alkaline solution having a pH of 10-13 as a polishing liquid.

(4) A method of producing a bonded wafer according to item (1), wherein the scattering of the terrace width is not more than 100 μm over a full periphery of the wafer except for a notch of orientation flat part.

(5) A method of producing a bonded wafer according to item (1), wherein the smoothness of the outer peripheral face of the active layer is not more than 5 μm.

(6) A method of producing a bonded wafer according to item (1), wherein the polishing of the terrace portion is carried out while maintaining a polishing amount of not more than 0.1 μm.

(7) A method of producing a bonded wafer according to item (1), wherein the active layer after the polishing has a thickness of not more than 0.3 μm.

(8) A method of producing a bonded wafer according to item (1), wherein the polishing is carried out by using a sheet-feed polishing machine.

(9) A method of producing a bonded wafer according to item (1), wherein the polishing is carried out by using a polishing machine having a position control function.

(10) A bonded wafer produced by a method described in any one of items (1)-(9).

According to the invention, it is possible to provide a method of producing a bonded wafer wherein island-shaped projections retained on the terrace portion can be effectively removed by polishing the terrace portion of the active layer with a predetermined fixed grain abrasive cloth at a small polishing amount on the surface of the terrace portion.

BRIEF DESCRIPTION OF THE DRAWINGS

FIGS. 4(a) and (b) are photographs of an outer peripheral portion in a bonded wafer of Example 1 as observed by means of an optical microscope with magnifications of 30 times and 120 times, respectively, and FIGS. 4(c) and (d) are photographs of an outer peripheral portion in a bonded wafer of Comparative Example 1 as observed by means of an optical microscope with magnifications of 30 times and 120 times, respectively.

DESCRIPTION OF THE PREFERRED EMBODIMENTS

The invention is a method of producing a bonded wafer by bonding a wafer for an active layer ion-implanted with a light element such as hydrogen or helium to a given depth position onto a wafer for a supporting substrate, and thereafter exfoliating the wafer for the active layer at the ion-implanted portion of the given depth position through a heat treatment to leave an active layer on an outer peripheral portion of the wafer for the supporting substrate and then polishing a terrace portion of the active layer formed on the outer peripheral portion of the wafer for the supporting substrate due to sagging of an outer peripheral portion of the wafer for the active layer during the exfoliation.

Figure 1:
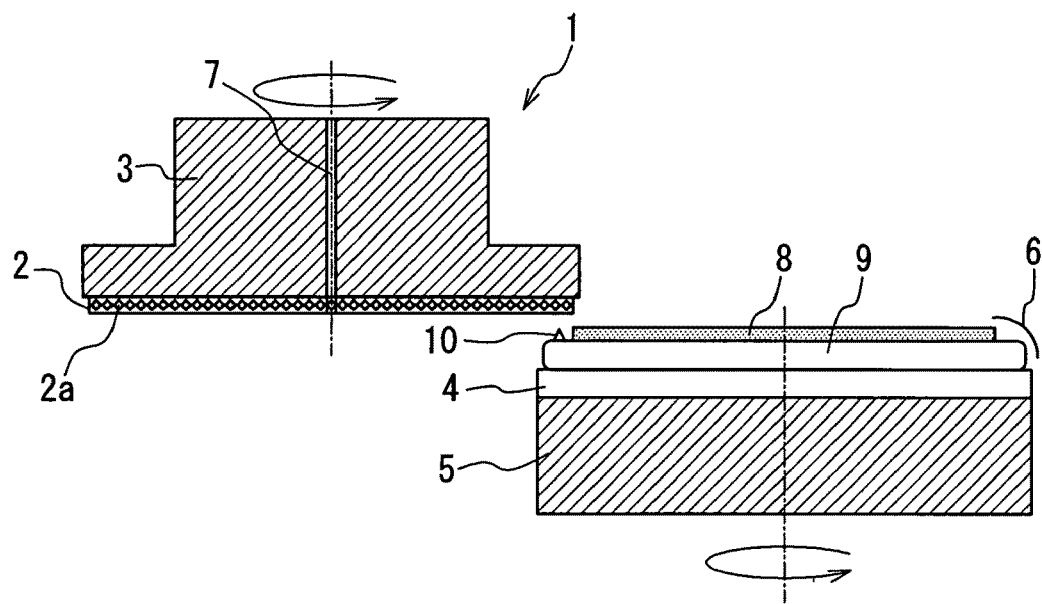
FIG. 1 is a schematically section view of a main part of a sheet-feed polishing machine suitable for use in the production method of the invention and illustrating a state just before the polishing of a bonded wafer.
Figure 2:
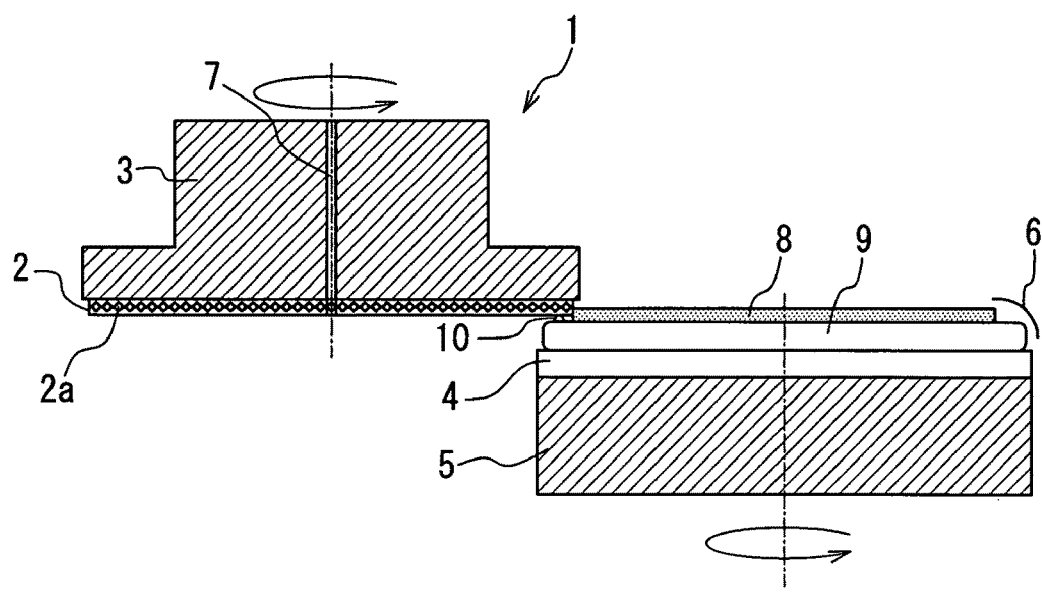
FIG. 2 is a schematically section view of a main part of a sheet-feed polishing machine suitable for use in the production method of the invention and illustrating a state of polishing a bonded wafer.

FIGS. 1 and 2 are views illustrating a main part of a polishing machine suitable for conducting a step of polishing a terrace portion of an active layer after the exfoliation in the method of producing a bonded wafer according to the invention together with the bonded wafer to be polished, in which FIG. 1 shows a state just before the polishing and FIG. 2 shows a polishing state. In these figures, numeral 1 is a sheet-feed polishing machine, numeral 2 a fixed grain abrasive cloth, numeral 3 a polishing head, numeral 4 an adsorption pad, numeral 5 a polishing table, numeral 6 a bonded wafer, numeral 7 a conduit for introducing a polishing liquid, numeral 8 an active layer, numeral 9 a wafer for a supporting substrate, and numeral 10 SOI islands as an island-shaped projection.

The illustrated polishing machine 1 (sheet-feed polishing machine in FIGS. 1 and 2) is mainly constructed with the rigid polishing head 3 provided on its surface with the fixed grain abrasive cloth 2 embedding many fixed grains 2a therein and the polishing table 5 provided on its surface with the adsorption pad 4. The bonded wafer 6 is fixed and mounted to the polishing table 5 through the adsorption pad 4, while the fixed grain abrasive cloth 2 is moved downward from above the bonded wafer 6 up to a given position, and then the surface and outer peripheral portion of the active layer constituting the bonded wafer 6 are polished while feeding the polishing liquid through the conduit 7 disposed in a central position of the polishing head 3, if necessary.

The production method of the invention is a method of producing a bonded wafer by using a wafer for an active layer and a wafer for a supporting substrate through a so-called smart cut method, more concretely, a method wherein the thickness and roughness of the active layer are controlled by bonding a wafer for an active layer ion-implanted with a light element such as hydrogen or helium to a given depth position onto a wafer for a supporting substrate, and thereafter exfoliating the wafer for the active layer at the ion-implanted portion of the given depth position through a heat treatment to leave an active layer on an outer peripheral portion of the wafer for the supporting substrate and then subjecting the surface of the wafer for the active layer to a thermal oxidation and an annealing in Ar.

Figure 3:
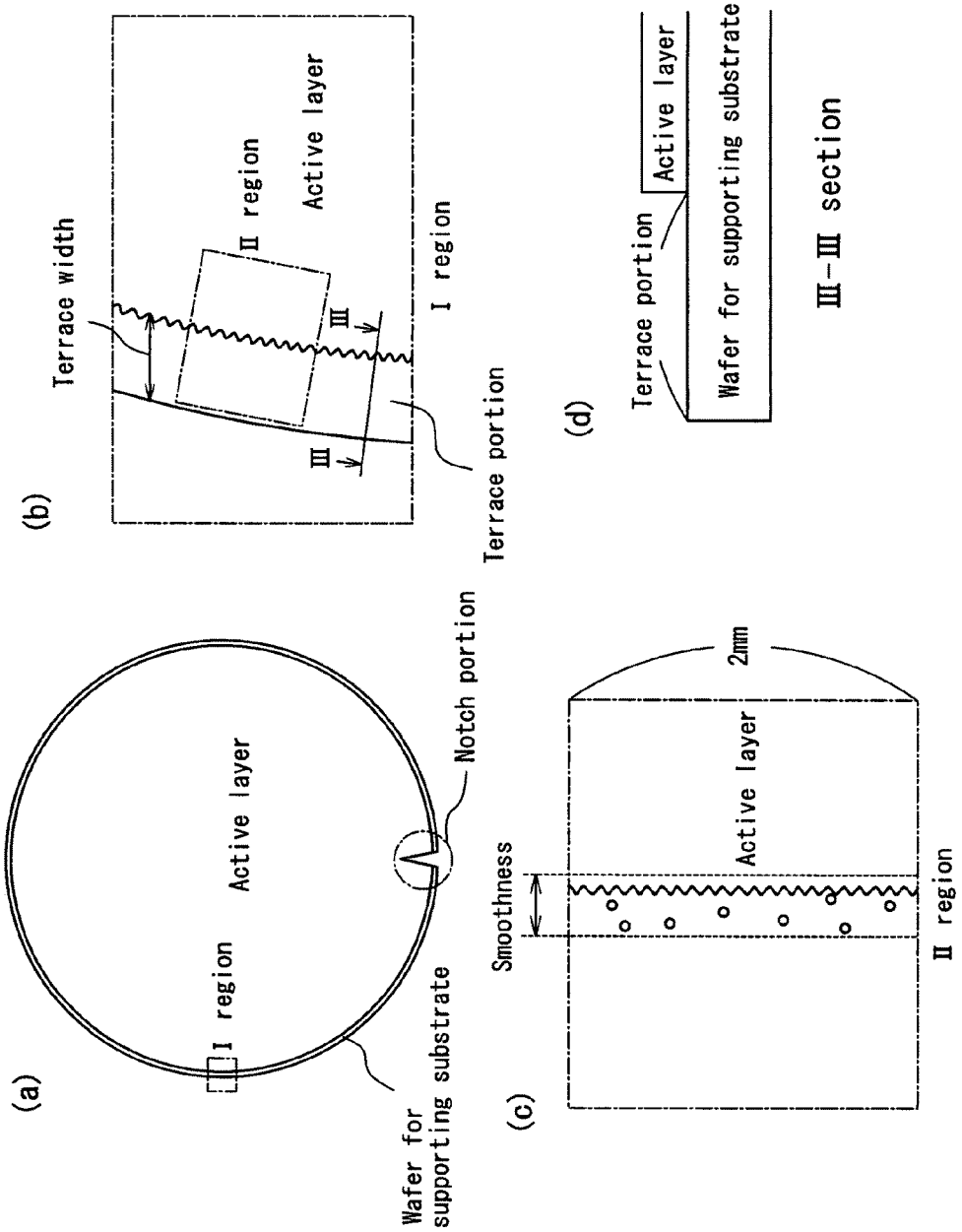
FIG. 3 is a schematic view of a bonded wafer wherein (a) is a plan view, (b) shows an I-region of (a), (c) shows a II-region of (b) and (d) is a section view taken along a line III-III of (b)

In the bonded wafer, it is known that a terrace portion is inevitably formed on the outer peripheral portion of the wafer for the supporting substrate due to the sagging of an outer peripheral portion of the wafer for the active layer during the exfoliation. FIGS. 3(a)-(d) show conceptually the bonded wafer just after the exfoliation, wherein FIG. 3(a) is a plan view, FIG. 3(b) shows an I-region of (a), FIG. 3(c) shows a II-region of (b) and FIG. 3(d) is a section view taken along a line III-III of (b). In the bonded wafer just after the exfoliation, as shown in FIGS. 3(a)-(d), the outer peripheral face of the active layer is undulated in the form of deeply-indented coastline to cause a large scattering of a terrace width, and also a part of the active layer is fixed and retained on the terrace portion as island-shaped projections being called as SOI islands during the exfoliation, so that they have problems as previously mentioned. Therefore, it is necessary that the terrace portion of the active layer is polished to make the scattering of the terrace width small and remove the island-shaped projections to thereby make the smoothness of the outer peripheral face of the active layer small.

The term "scattering of terrace width" used herein means a difference between maximum value and minimum value of the terrace width over a fill periphery of the wafer. It is preferable that the scattering range of the terrace width is not more than 100 μm over the full periphery. Moreover, the terrace width of a notch portion or an orientation flat portion (not shown) is not taken into account.

Also, the term "smoothness of outer peripheral face of active layer" used herein means an extent of SOI islands retaining from the outer peripheral face of the active layer when the outer peripheral face of the active layer is viewed from above the wafer at a given visual range as shown in FIG. 3(c). It is preferable that the extent of the smoothness of the outer peripheral face of the active layer is not more than 5 μm.

Further, the thickness of the active layer in the production method of the invention is not more than 0.3 μm in relation to the energy of hydrogen implantation using the smart cut method.

A main feature in the construction of the invention lies in the use of the specified fixed grain abrasive cloth as a means for polishing the terrace portion of the active layer after the exfoliation. More concretely, the fixed grain abrasive cloth comprises a urethane bonding material made from a soft segment having a polyfunctional isocyanate and a hard segment having a polyfunctional polyol and having an expansion ratio of 1.1-1.4 times, and silica having an average particle size of 0.2-10 μm and a hydroxy group, and a ratio of the hard segment in the urethane bonding material is 40-60% as a molecular weight ratio and a ratio of silica in the whole of the fixed grain abrasive cloth is 20-70 volume %, and the fixed grain abrasive cloth has a Shore D hardness of 40-100.

In the invention, as shown in FIGS. 1 and 2, the outer peripheral portion of the active layer, particularly the boundary portion between the active layer and the terrace portion is polished by using the above fixed grain abrasive cloth having the above construction, whereby the SOI islands resulted from the exfoliation of the active layer can be effectively removed while controlling the scattering of the terrace width and the smoothness of the outer peripheral face of the active layer.

The reason why the expansion ratio of the urethane bonding material is limited to 1.1-4 times is due to the fact that when it is less than 1.1 times, the abrasive cloth becomes too hard and easily damages the wafer, while when it exceeds 4 times, the abrasive cloth becomes too soft and can not remove the SOI islands retained on the terrace portion sufficiently.

When the ratio of the hard segment in the urethane bonding material is less than 40% as a molecular weight ratio, the sufficient hardness is not obtained and also the steep terrace portion can not be obtained due to the sagging in the polishing. While, when it exceeds 60%, the hardness becomes too high and there is a fear of causing a flaw such as scratch or the like on the polished surface of the wafer. Moreover, the level of this flaw is a level capable of removing the flaw in the subsequent finish polishing, but since the invention omits the finish polishing, the upper limit of the ratio of the hard segment in the urethane bonding material is 60%.

Further, the reason why the average particle size of silica constituting the fixed grain abrasive cloth is limited to a range of 0.2-10 μm is due to the fact that when it is less than 0.2 μm, the SOI islands fixed on the terrace portion of the active layer can not be removed sufficiently, while when it exceeds 10 μm, the flaw is liable to be easily generated in the rear face of the wafer. Moreover, the level of such a flaw is a level capable of removing the flaw in the subsequent finish polishing, but since the invention omits the finish polishing, the upper limit of the average particle size of silica is 10 μm.

As the silica, it is preferable to use silica having a hydroxy group because it is excellent in the compatibility with the urethane bonding material.

Also, the reason why the ratio of silica in the whole of the fixed grain abrasive cloth is limited to a range of 20-60 volume % is due to the fact that when the ratio is less than 20 volume %, the polishing speed extremely lowers, while when it exceeds 60 volume %, the flaw is liable to be easily generated in the polished surface of the wafer.

In addition, the reason why the Shore D hardness of the fixed grain abrasive cloth is limited to 40-100 is due to the fact that when the hardness is less than 40, the steep terrace portion is not obtained due to the sagging in the polishing, while when it exceeds 100, the cloth becomes too hard and the flaw is liable to be easily generated in the polished surface of the wafer. Moreover, the level of such a flaw is a level capable of removing the flaw in the subsequent finish polishing, but since the invention omits the finish polishing, the upper limit of the Shore D hardness is 100.

At this moment, the Shore D hardness is measured according to a method defined in JIS K6253-1997 or ISO 7619.

In the invention, the aforementioned effects can be developed by adopting the above constitutional elements.

Particularly, according to the invention, the SOI islands existing in the terrace portion on the outer peripheral portion of the wafer for the supporting substrate can be removed by polishing the terrace portion with the fixed grain abrasive cloth having the above construction at a less total polishing amount. For example, when the outer peripheral portion of the wafer for the supporting substrate in the bonded wafer having a diameter of 300 mm corresponding to the terrace portion after the heat treatment above 1100° C. is polished so as to render the scattering of the terrace width into not more than 100 μm and the smoothness of the outer peripheral face of the active layer into not more than 5 μm, according to the method of the invention, the surface of the terrace portion is polished only at a less polishing amount of not more than 0.1 μm, and hence the step between the active layer and the wafer for the supporting substrate can be maintained surely.

Also, the polishing step according to the invention is preferable to be conducted by mechanical and chemical polishing while feeding a polishing liquid onto the fixed grain abrasive cloth. As the polishing liquid is preferable an alkaline solution having a pH of 10-13. When the value of pH is outside the above range, the polishing rate lowers and the treating time tends to become long. As the alkaline solution are mentioned a solution of sodium hydroxide (NaOH), a solution of potassium hydroxide (KOH) and the like.

Also, it is preferable to conduct the polishing by means of a sheet-feed polishing machine.

Moreover, the polishing machine is preferable to have a position control function in view of a point that only the SOI islands existing on the terrace portion in the wafer can be effectively removed at a slight total polishing amount.

According to the method of the invention can be obtained a bonded wafer in which the SOI islands retaining on the terrace portion are removed while controlling the scattering of the terrace width and the smoothness of the outer peripheral face of the active layer.

Although the above merely shows an embodiment of the invention, various modifications may be added within a scope of the invention. Moreover, the bonded wafer includes a case that an oxide film (insulating film) is existent between the wafer for the supporting substrate and the active layer, and a case that the oxide film is not existent.

EXAMPLE 1

After the formation of an oxide film having a size of 1500 Å, a silicon wafer for an active layer having a size of 300 mm is subjected to an ion implantation of a hydrogen gas (acceleration voltage: 50 keV, dose: $1 \times 10^7/cm^2$) and the bonded onto a wafer for a supporting substrate. The resulting bonded wafer is subjected to a heat treatment in a nitrogen atmosphere at 500° C. for 30 minutes to exfoliate the wafer for the active layer at the hydrogen ion-implanted position, and thereafter an outer surface and a terrace portion of the resulting active layer are subjected to a polishing. The polishing on the terrace portion of the active layer is a system of conducting the polishing every one wafer as shown in FIGS. 1 and 2. In this case, a sheet-feed polishing machine is used to conduct the polishing while feeding an alkaline solution of KOH having a pH of 11 as a polishing liquid onto a fixed grain abrasive cloth comprising a urethane bonding material made from a soft segment of polyfunctional isocyanate and a hard segment of polyfunctional polyol and having an expansion ratio o f 2 times and silica having an average particle size of 2 μm and a hydroxy group wherein an existing ratio of the hard segment is 50% of a total bonding agent as a molecular weight ratio and a volume ratio of silica is 40% and a Shore D hardness is 55 at a state of positioning the fixed grain abrasive cloth with respect to the outer peripheral portion of the active layer in the bonded wafer as shown in FIG. 2.

COMPARATIVE EXAMPLE 1

A bonded wafer is produced in the same manner as in Example 1 except that the polishing on the terrace portion of the active layer is not conducted.

COMPARATIVE EXAMPLE 2

A bonded wafer is produced in the same manner as in Example 1 except that the conventional free grain abrasive cloth is used instead of the above fixed grain abrasive cloth.

(Evaluation Method)

With respect to the thus obtained bonded wafers, the observation and retaining ratio of SOI islands, measurement of the scattering of terrace width and measurement of smoothness of the outer peripheral face of the active layer are carried out by using an optical microscope. The observation results of SOI islands are shown in FIG. 4, and the measured results on the retaining ratio of SOI islands, scattering of terrace width, smoothness of the outer peripheral face of the active layer and polishing amount on the surface of the terrace portion are shown in Table 1.

TABLE 1

| | Retaining ratio of SOI islands (islands/mm$^2$) | Scattering of terrace width (μm) | Smoothness of outer peripheral face of active layer (μm) | Polishing amount on surface of terrace portion (μm) |
| --- | --- | --- | --- | --- |
| Example 1 | 0 | 70 | 4 | 0.05 |
| Comparative Example 1 | 49 | 300 | >100 | 0 |
| Comparative Example 2 | 2 | 150 | 10 | 2 |

As seen from the results of Table 1, all of the retaining ratio of SOI islands, the scattering of terrace width and the smoothness in Example 1 are better as compared with those of Comparative Examples 1 and 2. As to the total polishing amount of the terrace portion, the result of Example 1 is substantially equal to that of Comparative Example 1, while the value of Comparative Example 2 is larger than that of Example 1.

According to the invention, it is possible to provide a method of producing a bonded wafer wherein island-shaped projections retained on t he terrace portion can be effectively removed by polishing the terrace portion of the active layer with a predetermined fixed grain abrasive cloth at a small polishing amount on the surface of the terrace portion.

What is claimed is:

1. A method of producing a bonded wafer comprising: bonding a wafer for an active layer ion-implanted with a light element such as hydrogen or helium to a given depth position onto a wafer for a supporting substrate, and thereafter exfoliating the wafer for the active layer at the ion-implanted portion of the given depth position through a heat treatment to leave an active layer on an outer peripheral portion of the wafer for the supporting substrate and then polishing a terrace portion formed on the outer peripheral portion of the wafer for the supporting substrate to remove island-shaped projections fixed on the terrace portion and made from a sagged part of the wafer for the active layer, in which the polishing of the terrace portion of the active layer is carried out with a predetermined fixed grain abrasive cloth while controlling a scattering of terrace width and smoothness of an outer peripheral face of the active layer to a given range and wherein the fixed grain abrasive cloth comprises a cloth and many fixed grains embedded within the cloth, the cloth comprising a urethane bonding material made from a soft segment having a polyfunctional isocyanate and a hard segment having a polyfunctional polyol and having an expansion ratio of 1.1-1.4 times, and the fixed grains comprising silica having an average particle size of 0.2-10 μm and a hydroxy group, and a ratio of the hard segment in the urethane bonding material is 40-60% as a molecular weight ratio and a ratio of silica in the whole of the fixed grain abrasive cloth is 20-70 volume %, and the fixed grain abrasive cloth has a resulting Shore D hardness of between 40 and 100.

2. A method of producing a bonded wafer according to claim 1, wherein the polishing is carried out by using an alkaline solution having a pH of 10-13 as a polishing liquid.

3. A method of producing a bonded wafer according to claim 1, wherein the scattering of the terrace width is not more than 100 μm over a full periphery of the wafer except for a notch of orientation flat part.

4. A method of producing a bonded wafer according to claim 1, wherein the smoothness of the outer peripheral face of the active layer is not more than 5 μm.

5. A method of producing a bonded wafer according to claim 1, wherein the polishing of the terrace portion is carried out while maintaining a polishing amount of not more than 0.1 μm.

6. A method of producing a bonded wafer according to claim 1, wherein the active layer after the polishing has a thickness of not more than 0.3 μm.

7. A method of producing a bonded wafer according to claim 1, wherein the polishing is carried out by using a sheet-feed polishing machine.

8. A method of producing a bonded wafer according to claim 1, wherein the polishing is carried out by using a polishing machine capable of controlling the position of the polishing.

9. A bonded wafer produced by a method as claimed in any one of claims 1 and 2 to 8.

* * * * *